US006861724B2

(12) United States Patent
Seki

(10) Patent No.: US 6,861,724 B2
(45) Date of Patent: Mar. 1, 2005

(54) SEMICONDUCTOR INTEGRATED CIRCUIT

(75) Inventor: Hiroshi Seki, Suwa (JP)

(73) Assignee: Seiko Epson Corporation, Tokyo (JP)

(*) Notice: Subject to any disclaimer, the term of this patent is extended or adjusted under 35 U.S.C. 154(b) by 20 days.

(21) Appl. No.: 10/647,529

(22) Filed: Aug. 26, 2003

(65) Prior Publication Data

US 2004/0113224 A1 Jun. 17, 2004

(30) Foreign Application Priority Data

Sep. 11, 2002 (JP) ......................................... 2002-265369

(51) Int. Cl.[7] .............................................. H01L 29/00
(52) U.S. Cl. ....................................... 257/500; 257/365
(58) Field of Search ................................ 257/500, 365, 257/393, 271

(56) References Cited

U.S. PATENT DOCUMENTS 5,657,292 A * 8/1997 McClure ..................... 365/233
5,847,432 A * 12/1998 Nozaki ........................ 257/369
2003/0117171 A1 * 6/2003 Uno ............................. 326/81

* cited by examiner

Primary Examiner—Phat X. Cao
(74) Attorney, Agent, or Firm—Oliff & Berridge, PLC

(57) ABSTRACT

The invention provides an integrated circuit that permits input of a signal of a potential which is higher than a power supply voltage supplied to an interface circuit and also higher than a maximum rated voltage allowable for a gate electrode of a transistor forming an interface circuit, even in a non-access mode. The invention can include a gate voltage control circuit that produces a gate voltage to be applied to a gate electrode of a transfer gate which is connected between an external input terminal and an input end of an input buffer and transmits an external signal input from the external input terminal to the input end of the input buffer. The gate voltage control circuit outputs, as the gate voltage, a voltage produced based on a relatively high first voltage to be applied as a power supply voltage of a semiconductor integrated circuit in the access mode while outputting, as the gate voltage, a voltage produced based on a relatively low second voltage to be applied as a power supply voltage of the semiconductor integrated circuit in the non-access mode.

6 Claims, 7 Drawing Sheets

SEMICONDUCTOR INTEGRATED CIRCUIT

BACKGROUND OF THE INVENTION

1. Field of Invention

The invention relates to a semiconductor integrated circuit that suspends operation of an interface circuit, which exchanges a signal with an external unit, in a non-access mode that an external access is not executed. More particularly, the invention is directed to a semiconductor integrated circuit including an interface circuit capable of receiving an external signal of a potential higher than a power supply voltage applied to the interface circuit.

2. Description of Related Art

In order to promote power saving in electronic devices, such as ICs and LSIs (semiconductor integrated circuit) for various electronic apparatuses, it is attempted to reduce power supply voltages to be supplied, and some electronic devices are driven with 3.3V or 3V (hereinafter also referred to as '3V group') power supply voltages. Furthermore, others are driven with 1.8V or 1.5V (hereinafter referred to as '1V group') power supply voltages.

However, not all electronic devices mounted in electronic apparatuses similarly employ such reduced power supply voltages. In some cases, an electronic device that operates with a 5V (hereinafter also referred to as '5V group') power supply voltage of prior art and an electronic device that operates with the 3V group power supply voltage may be provided in a mixed manner.

Generally, a maximum rated voltage (also referred to as a 'withstand voltage') at a gate electrode of a transistor forming an electronic device which operates with the 3V group power supply voltage (hereinafter, simply referred to as '3V group electronic device') is greater than the 3V group power supply voltage. However, it is lower than a withstand voltage at a transistor forming an electronic device which operates with the 5V group power supply voltage (hereinafter, simply referred to as '5V group electronic device'), and also lower than a potential of a signal output from the 5V group electronic device (hereinafter referred to as '5V group signal'). This means that the 5V group signal cannot externally be input to the 3V group electronic device.

Thus, in order to solve this problem of the withstand voltage, as described below, it is conceived employing a method of allowing the 3V group electronic device to receive not only a signal output from the 3V group electronic device (hereinafter referred to as '3V group signal'), but also the 5V group signal.

FIG. 6 is an explanatory diagram illustrating an interface circuit capable of receiving both the 3V group and 5V group signals. As shown in FIG. 6(A), this interface circuit includes an external input terminal (pad) PD and a transfer gate QTN (also referred to as 'transmission gate') including an n-type MOS transistor (hereinafter, also referred to as 'NMOS transistor') between the external input terminal PD and an input buffer 11B. Then, the 3V group voltage (3.3V in this example), the same as a power supply voltage supplied to the input buffer IB, is applied as a gate voltage VG to a gate electrode G of the transfer gate QTN.

As shown in FIG. 6(B), a potential VD of a drain electrode D of the transfer gate QTN is equal to a potential VPD of an input data signal to be input from the external input pad PD and varies in response to a change in the potential VPD. More specifically, when the potential VPD changes from 0V to 5V, the potential VD of the drain electrode D also changes from 0V to 5V. On the other hand, a potential VS of a source electrode S changes in response to a change in the potential VPD while the potential VPD is lower than a voltage, (VG−VTN)[V], which is lower than the gate voltage VG (=3.3V) by a threshold voltage VTN. However, the potential VS remains constant at (VG−VTN)[V] when the potential VPD is the (VG−VTN)[V] voltage or more. Therefore, in this interface circuit, the 5V type signal greater than the withstand voltage of the MOS transistor forming the input buffer IB is input from the external input pad PD through the transfer gate QTN, enabling the signal to be converted into a signal lower than the power supply voltage (3.3 V), and then input to the input buffer IB.

Moreover, when a signal potential of an external data signal input from the external input pad PD is 5V, the drain voltage VD applied to the drain electrode D of the transfer gate QTN is 5V. Therefore, a voltage VDG between the drain electrode D and the gate electrode G of the transfer gate QTN is 1.7V. Furthermore, when a signal potential of an external data signal input from the external input pad PD is 0V, the drain voltage VD applied to the drain electrode D of the transfer gate QTN is 0V. Therefore, the voltage VDG between the drain and the gate of the transfer gate QTN is −3.3V. Here, used as an MOS transistor regularly used in a circuit which operates with the 3.3V group power supply voltage may be an MOS transistor in which at least the maximum rated voltage (withstand voltage) allowable for the gate electrode is greater than the power supply voltage 3.3V, and also the maximum rated voltage allowable as the voltage between the drain and the gate is greater than the power supply voltage 3.3V. Therefore, this reveals that the voltage applied between the drain electrode and the gate electrode of the transfer gate QTN is lower than the maximum rated voltage.

SUMMARY OF THE INVENTION

In light of the above aspects, in an attempt to further achieve power saving in electronic devices, it is conceived to realize an electronic device which employs the 3V group power supply voltage to be supplied to an interface circuit and the 1V type power supply voltage, which is lower than the 3V group voltage, to be supplied to an internal circuit of the electronic device. At the same time, with the electronic device, in the non-access mode that an external access is not executed, supply of the 3V group power supply voltage is suspended (shut off) in order to suspend operation of the interface circuit.

However, when the structure shown in the above mentioned FIG. 6 is used as such an interface circuit for which power supply is shut off, the following problems arise. Specifically, referring to FIG. 7, when supply of the 3.3V power supply voltage is suspended, the gate voltage VG applied to the gate electrode G of the transfer gate QTN changes from 3.3V to 0V.

Under this condition, when the external input pad PD is connected to a signal line in common with another device, for example, a bus, even an external data signal supplied to another device is also input from the external input pad PD. At this time, the voltage VDG between the drain and the gate of the transfer gate QTN is undesirably almost 5V.

Here, it is preferable for the withstand voltage of the transfer gate QTN to be lower in consideration of the operational speed. Used as an MOS transistor forming a circuit which operates with the 3.3V group power supply voltage is generally a transistor employing a voltage lower than 5V in which the maximum rated voltage allowable as the voltage VDG between the drain and the gate is also lower than 5V.

Therefore, the voltage VDG between the gate and the drain of the nMOS transistor forming the transfer gate QTN undesirably becomes greater than the allowable maximum rated voltage, thereby causing degradation of the reliability of the device. Particularly, employing a voltage greater than the absolute maximum rated voltage could be a factor for failures of the device. Thus, it is desirable to realize an interface circuit which allows input of a signal with a potential higher than a power supply voltage supplied to the interface circuit and also higher than a maximum rated voltage allowable for a gate electrode of an MOS transistor forming the interface circuit even in a non-access mode that power supply to the interface circuit is suspended.

This invention has been achieved in order to resolve the above problems in prior art technology, and intends to provided a technology, which allows input of a signal with a potential higher than a power supply voltage supplied to an interface circuit and also higher than a maximum rated voltage allowable for a gate electrode of a transistor forming the interface circuit in a semiconductor integrated circuit in which power supply to the interface circuit is suspended in a non-access mode.

In order to resolve at least part of the above mentioned problems, a semiconductor integrated circuit of the invention can include an interface circuit which receives a relatively high first voltage and a relatively low second voltage as power supply voltages, and suspends operation of the interface circuit in a non-access mode that an external access is not executed by shutting off supply of the first voltage to be applied to the interface circuit that receives an externally supplied signal. The interface circuit can include an input buffer that operates by applying at least the first voltage as the power supply voltage, a transfer gate that is connected to and between an external input terminal and an input end of the input buffer and transmits an external signal input from the external input terminal to the input end of the input buffer, and a gate voltage control circuit that outputs a gate voltage to be applied to a gate electrode of the transfer gate. The gate voltage control circuit outputs a voltage produced based on the first voltage as the gate voltage in an access mode that an external access is executed while outputting a voltage produced based on the second voltage as the gate voltage in the non-access mode.

According to the semiconductor integrate circuit with the above structure, when supply of the power supply voltage including the first voltage to be applied to the interface circuit is shut off in the non access mode that the external access is not executed, the voltage produced based on the second voltage can be applied to the gate electrode of the transfer gate, which is a difficulty in prior art. Consequently, as explained in the above, it is possible to prevent the potential of the gate electrode of the transfer gate from becoming 0V and a voltage between a drain and a gate of the transfer gate from becoming greater than the allowable maximum rated voltage.

Here, the gate voltage control circuit can include four (4) p-type MOS transistors formed in a same n-type substrate region, and it is preferable that, of the four (4) p-type MOS transistors. A first p-type MOS transistor can include a source electrode, to which the first voltage is applied, and a drain electrode, to which the gate electrode of the transfer gate is connected, and turns on in the access mode so as to output a voltage almost equal to the first voltage to the gate electrode of the transfer gate. A second p-type MOS transistor can include a source electrode, to which the second voltage is applied, and a drain electrode, to which the gate electrode of the transfer gate is connected, and turns on in the non-access mode so as to output a voltage almost equal to the second voltage to the gate electrode of the transfer gate. A third p-type MOS transistor can include a source electrode, to which the first voltage is applied, and a drain electrode, to which a first electrode in the n-type substrate region is connected, and turns on in the access mode, thereby performing charging such that a potential of the n-type substrate region becomes almost equal to the first voltage. A fourth p-type MOS transistor can include a source electrode, to which the second voltage is applied, and a drain electrode, to which a second electrode in the n-type substrate region is connected, and turns on in the non-access mode, thereby performing charging such that the potential of the n-type substrate region becomes almost equal to the second voltage.

According to the above structure, the gate voltage control circuit can easily be formed inside the semiconductor integrated circuit. Moreover, it is preferably that each MOS transistor forming the interface circuit is an MOS transistor in which a maximum rated voltage at a gate electrode is greater than the first voltage and lower than a third voltage corresponding to a high level voltage of the external signal, and the second voltage is set such that a voltage difference between the third voltage and the second voltage is lower than the maximum rated voltage.

In the semiconductor integrated circuit with the above-mentioned relation among the above first voltage, the second voltage and the third voltage, supply of the power supply voltage including the first voltage to be applied to the interface circuit is shut off in the non access mode that the external access is not executed, so that it is possible to effectively prevent the voltage between the drain and the gate of the transfer gate from becoming greater than the allowable maximum rated voltage. Here, the maximum rated voltage can include an absolute maximum rated voltage.

Furthermore, for example, the first voltage may be a voltage in the range from 3V to 3.6V, the second voltage may be a voltage in the range from 1.65V to 1.95V, and the third voltage may be a voltage in the range from 4.5V to 5.5V.

BRIEF DESCRIPTION OF THE DRAWINGS

The invention will be described with reference to the accompanying drawings, wherein like minerals reference like elements, and wherein.

DETAILED DESCRIPTION OF PREFERRED EMBODIMENTS

An embodiment of the invention is explained below based on an example in the following order.

Figure 1:
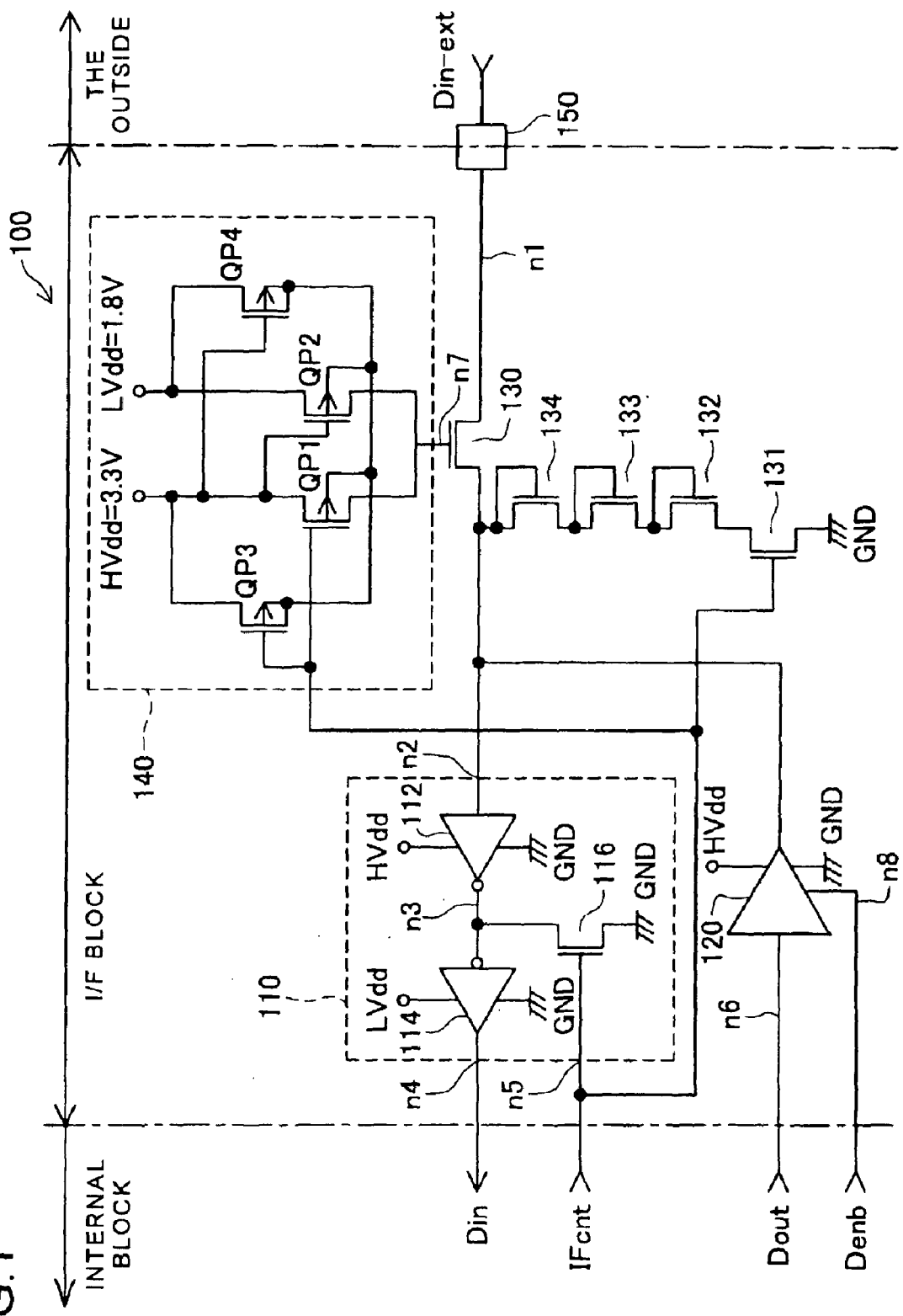
FIG. 1 is a circuit diagram showing an interface circuit included in a semiconductor integrated circuit as an example of the invention.

FIG. 1 is a circuit diagram of an interface circuit included in a semiconductor integrated circuit as an example of the present invention. This semiconductor integrated circuit can be divided mainly to an interface block including the interface circuit for exchanging signals with an external unit and an internal block including various internal circuits. To this integrated circuit, two kinds of power supply voltages are supplied from two kinds of power supply input terminals HVdd and LVdd not shown in the figure. Suppose that a voltage of the first power supply input terminal HVdd is (3.3±0.3)V, and a voltage of the second power supply input terminal LVdd is (1.8±0.15)V. Hereinafter, the voltage of the first power supply input terminal HVdd is referred to as the first power supply HVdd or the first power supply voltage HVdd, and the voltage of the second power supply input terminal LVdd is referred to as the second power supply LVdd or the second power supply voltage LVdd. The first power supply HVdd is a power supply for the interface circuit, and the second power supply LVdd is a power supply for the internal circuits. Moreover, (3.3±0.3)V indicates that a standard voltage is 3.3V and the error range is ±0.3V, and that the first power supply voltage HVdd can be any voltage value in the range from 3V to 3.6V. The same connotation can be applied to the other voltage.

FIG. 1 shows one interface circuit 100 included in the interface block. This interface circuit 100 can include an input buffer 110, an output driver 120, a transfer gate 130 and a gate voltage control circuit 140. Each of a p-type MOS transistor (hereinafter, simply referred to as pMOS transistor) and an n-type MOS transistor (hereinafter, simply referred to as nMOS transistor) forming a corresponding circuit is explained on the premise that the thickness of a gate oxide film is tox ≈70 Å, and absolute maximum rated voltages allowable for a gate electrode, between a gate and a drain and between the gate and a source, respectively, are within the range from 4 to 4.6V.

The input buffer 110 can include two CMOS type inverters 112 and 114. An input end n2 of the input buffer 110 serves also as an input end of the first inverter 112, and an output end n3 of the first inverter 112 is connected to an input end of the second inverter 114. An output end of the second inverter 114 also serves as an output end n4 of the input buffer 110. One power supply input end of the first inverter 112 is connected to the first power supply terminal HVdd and provided with the first power supply voltage HVdd (=3.3V) for the interface circuit while the other end is connected to a ground potential GND. One power supply input end of the second inverter 114 is connected to the second power supply terminal LVdd and provided with the second power supply voltage LVdd (=1.8V) for the internal circuits while the other end is connected to a ground potential GND.

The input buffer 110 outputs an external data signal Din-ext input through the transfer gate 130 as an input data signal Din to an internal circuit, not illustrated in the figure, in the internal block.

Furthermore, an nMOS transistor 116 with a drain electrode connected to a node n3 and with a source electrode connected to a ground potential GND is interposed between the output end n3 of the first inverter 112 and the ground potential GND. Also, a gate electrode of this NMOS transistor 116 is connected to a control signal input end n5 to which an interface control signal IFcnt is input from a control circuit, not illustrated in the figure, in the internal block.

The interface control signal IFcnt turns low level (L level) in an access mode that a 3.3V voltage is supplied as the first power supply HVdd and then an external access is executed. The signal turns high level ("H" level) in a non-access mode that supply of the first power supply HVdd is shut off and then an external access is not executed. The interface control signal IFcnt is produced with the internal circuit in the internal block, and a voltage of the "H" level is approximately equal to the second power supply voltage while a voltage of the "L" level is equal to the ground potential GND (almost 0V).

This nMOS transistor 116 functions as a clamp circuit as described in greater detail below. In the non-access mode, the voltage of the first power supply HVdd changes from 3.3V to 0V, and the first inverter 112 suspends its operation, so that the level of the output end n3 becomes unstable. At that time, since the interface control signal IFcnt becomes the "H" level, the NMOS transistor 116 thereby turns on so as to fix the potential of the output end n3 to the ground potential GND, namely, the "L" level. Moreover, in the access mode, the NMOS transistor 116 turns off, so that the potential of the output end n3 varies in response to the level of the input end n2.

The output driver 120 also can include a CMOS type circuit. One power supply input end of the output driver 120 is connected to the first power supply terminal HVdd and provided with the first power supply voltage HVdd (=3.3V) for the interface circuit while the other end is connected to a ground potential GND. A data input end n6 receives a data signal Dout output from an internal circuit, not shown in the figure, in the internal block, and an output end is connected to the input end n2 of the input buffer 110. Furthermore, an input end n8 for an enable signal to determine whether or not to permit output of the input data signal Dout receives the enable signal Denb output from the control circuit, not shown in the figure, in the internal block. When the enable signal Denb is activated, the data signal Dout input from the data input end n6 is output from an external input and output pad 150 via the transfer gate 130. When the enable signal Denb is deactivated, the output end of the output driver 120 experiences high impedance and is thereby effectively isolated from the input end n2 of the input buffer 110. Used as this output driver 120 is an output buffer incorporating a fail safe function which can prevent a leakage current from occurring inside the circuit even when supply of the first power supply voltage HVdd is shut off and then an external signal is input to the input end n2. The output driver incorporating this fail safe function is commonly used, and thus explanation is omitted here.

The transfer gate 130 can include an NMOS transistor, and a drain electrode is connected to the external input and output pad 150 through a connecting end n1. Moreover, a source electrode is connected to the input end n2 of the input buffer 110, and a gate electrode is connected to an output end n7 of the gate voltage control circuit 140. Used as this NMOS transistor is a transistor with a threshold voltage VTN lower than that of the other nMOS transistors forming another circuit in the interface circuit 100. It is preferable for this threshold voltage VTN to be as low as possible, ideally 0V. In this example, the NMOS transistor with about 0.2V or lower is used, for instance.

A clamp circuit including four nMOS transistors 131 to 134 cascade-connected to each other is installed between the input end n2 of the input buffer 110 and a ground potential GND. A gate electrode of the NMOS transistor 131 connected to the ground potential GND is connected to the control signal input end n5 of the input buffer 110 and receives the interface control signal IFcnt similarly to the nMOS transistor 116 included in the above input buffer 110.

As to the other nMOS transistors 132, 133 and 134, a gate electrode and a drain electrode of the transistors are connected to each other, thereby forming a diode. When the NMOS transistor 131 turns on in the non-access mode, allowing an electric current to run from the input end n2 to the ground potential GND, this clamp circuit clamps the potential of the input end n2 not to become about 2.4 V or more, which is quadruple of the threshold voltage VTN when setting the threshold voltage VTN of each transistor to about 0.6V, for example. Since the NMOS transistor 131 turns off in the access mode, this clamp circuit does not operate, so that the potential of the input end n2 varies in response to a change in the external data signal Din-ext input through the transfer gate 130.

The gate voltage control circuit 140 outputs a gate voltage to be applied to the gate electrode of the transfer gate 130 to the gate electrode of the transfer gate 130 via the output end n7 in response to the access mode or the non-access mode.

The gate voltage control circuit 140 can include four (4) pMOS transistors QP1, QP2, QP3 and QP4. A source electrode of the first pMOS transistor QP1 is connected to the first power supply input terminal HVdd, and a drain electrode is connected to the output end n7 of the gate voltage control circuit 140. A gate electrode is connected to the control signal input end n5 of the input buffer 110 and receives the interface control signal IFcnt. This first pMOS transistor QP1 functions as a first switch circuit for applying the first power supply voltage HVdd to the gate electrode of the transfer gate 130 as the gate voltage as described in greater detail below.

A source electrode of the second pMOS transistor QP2 is connected to the second power supply input terminal LVdd, and a drain electrode is connected to the output end n7 of the gate voltage control circuit 140. A gate electrode is connected to the first power supply input terminal HVdd, and the first power supply voltage HVdd is applied to the gate electrode as the gate voltage. This second pMOS transistor QP2 functions as a second switch circuit for applying the second power supply voltage LVdd to the gate electrode of the transfer gate 130 as the gate voltage as described in greater detail below.

Here, a power supply voltage is ordinarily applied to a backgate electrode of the pMOS transistor. For example, the first power supply voltage HVdd (=3.3V) is applied to a backgate electrode of the first pMOS transistor QP1, and the second power supply voltage LVdd (=1.8V) is applied to a backgate electrode of the second pMOS transistor QP2. However, if the first power supply voltage HVdd is applied to the backgate electrode of the first pMOS transistor QP1 and the second power supply voltage LVdd is applied to the backgate electrode of the second pMOS transistor QP2, the following problems can arise.

Figure 2:
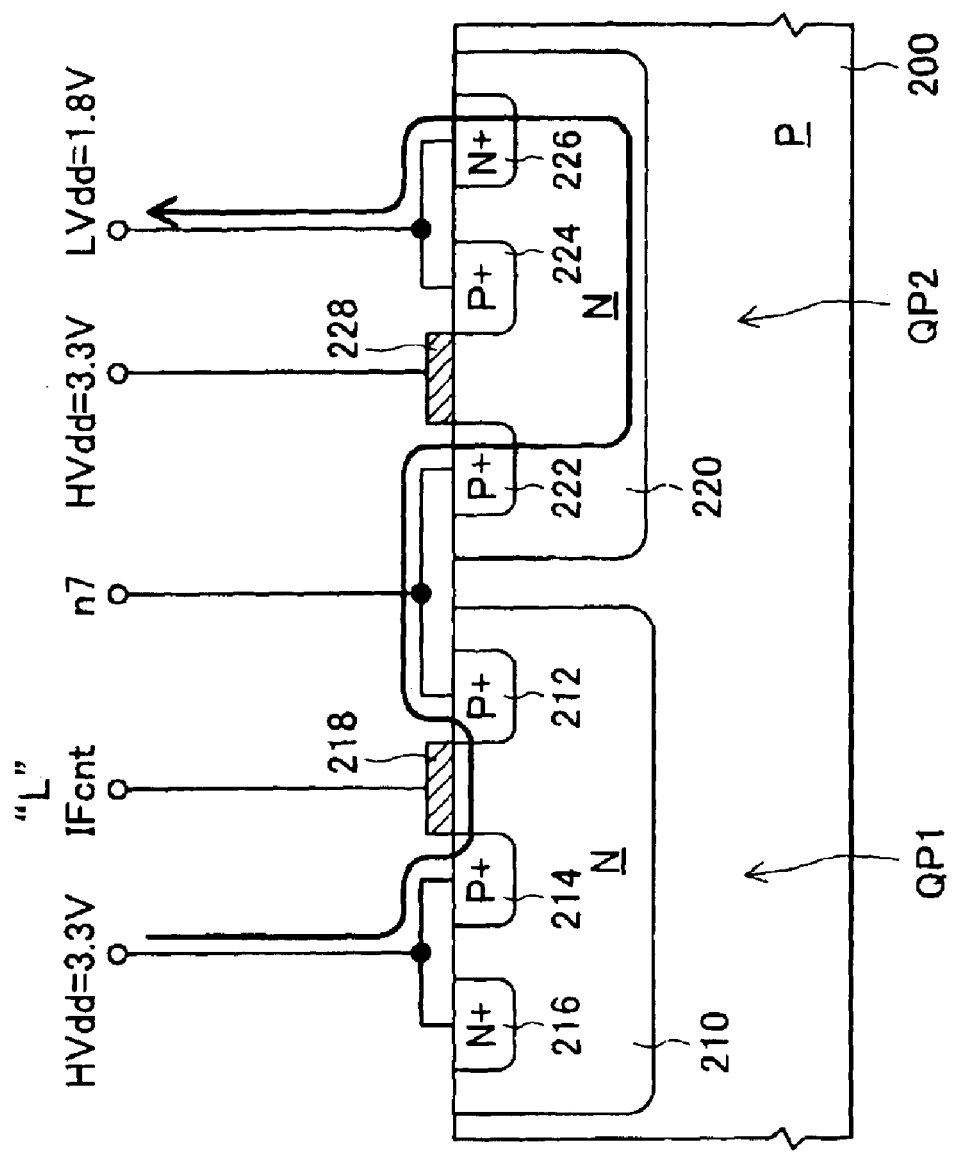
FIG. 2 is an explanatory diagram schematically showing a sectional structure in which backgates of the first and the second pMOS transistors QP1 and QP2 are connected to corresponding power supply voltages HVdd and LVdd, respectively.

FIG. 2 is an explanatory diagram schematically showing a sectional structure in the case of connecting the backgate electrodes of the first and the second pMOS transistors QP1 and QP2 to the corresponding terminals for power supply voltages HVdd and LVdd, respectively. The first transistor QP1 is formed inside an N well 210 (also referred to as n-type substrate region or backgate) formed in a p-type semiconductor substrate 200. Inside the N well 210, a region of p-type impurity 212 for a drain electrode (hereinafter, also simply referred to as drain electrode), a region of p-type impurity 214 for a source electrode (hereinafter, also simply referred to as source electrode), and a region of n-type impurity 216 for a backgate electrode (hereinafter, also simply referred to as backgate electrode) are formed. A gate electrode 218 of the first pMOS transistor QP1 is formed above the surface of the N well 210 (channel region) between the two regions of p-type impurity 212 and 214.

Similarly, the second transistor QP2 is formed within an N well 220 provided in the p-type semiconductor substrate 200. Inside the N well 220, a region of p-type impurity 222 for a drain electrode (hereinafter, also simply referred to as drain electrode), a region of p-type impurity 224 for a source electrode (hereinafter, simply referred to as source electrode) and a region of n-type impurity 226 for a backgate electrode (hereinafter, simply referred to as backgate electrode) are formed. A gate electrode 228 of the second pMOS transistor QP2 is formed above the surface of the N well 220 (channel region) between the two regions of p-type impurity 222 and 224.

The source electrode 214 and the backgate electrode 216 of the first pMOS transistor QP1 are connected to the first power supply terminal HVdd (3.3V). The source electrode 224 and the backgate electrode 226 of the second pMOS transistor QP2 are connected to the second power supply terminal LVdd (1.8V). The drain electrode 212 of the first pMOS transistor and the drain electrode 222 of the second pMOS transistor are connected to the output end n7 in common. The interface control signal IFcnt is input to the gate electrode 218 of the first pMOS transistor QP1. The gate electrode 228 of the second pMOS transistor QP2 is connected to the second power supply terminal HVdd.

Here, for example, suppose that the interface control signal IFcnt turns the "L" level, and thereby the first pMOS transistor QP1 turns on while the second pMOS transistor QP2 turns off. At that time, the junction surface between the drain electrode 222 of the second pMOS transistor QP2 and the N well 220 is forward-biased despite that the second pMOS transistor QP2 is in the "off" state. Therefore, a part of an electric current running from the source electrode 214 to the drain electrode 212 of the first pMOS transistor QP1 runs onto the second power supply terminal LVdd via the drain electrode 222, the N well 220 and the backgate electrode 226 of the second pMOS transistor QP2. In this manner, a leakage current undesirably runs through the second pMOS transistor QP2 which is supposed to be in the "off" state. Therefore, the backgate electrodes of the first pMOS transistor QP1 and the second pMOS transistor QP2 cannot be set to the corresponding power supply voltages, respectively. In consideration of this aspect, this example employs such a circuit structure as the one described below.

Specifically, as shown in Figs., the first through the fourth pMOS transistors QP1 to QP4 are formed in the same N well 210, thereby practically sharing a backgate electrode. Then, a region of p-type impurity 234 corresponding to a source electrode of the third pMOS transistor QP3 is connected to the first power supply input terminal HVdd, and a region of p-type impurity 232 corresponding to a drain electrode is connected to a region of n-type impurity 236 corresponding to a backgate electrode. Moreover, a region of p-type impurity 244 corresponding to a source electrode of the fourth pMOS transistor QP4 is connected to the second power supply input terminal LVdd, and a region of p-type impurity 242 corresponding to a drain electrode is connected to a region of n-type impurity 246 corresponding to a backgate electrode.

With the above structure, the circuit is charged such that the third pMOS transistor QP3 turns on and the potential of the N well 210 becomes the first power supply voltage HVdd when the first pMOS transistor QP1 corresponding to the first switch circuit is "on" and the second pMOS transistor QP2 corresponding to the second switch circuit is "off". Also, when the first pMOS transistor QP1 is "off" and the second pMOS transistor QP2 is "on", the circuit is charged such that the fourth pMOS transistor QP4 turns on and the potential of the N well 210 becomes the second power supply voltage LVdd. Consequently, it is possible to prevent the junction surface between a layer of p-type impurity corresponding to the drain electrode or the source electrode of any one of the transistors and the N well 210 from being forward-biased, so as to avoid generation of a leakage current.

Next, operations of the gate voltage control circuit 140 and the transfer gate 130 are explained both in the cases of the access mode and the non-access mode, separately.

Figure 3:
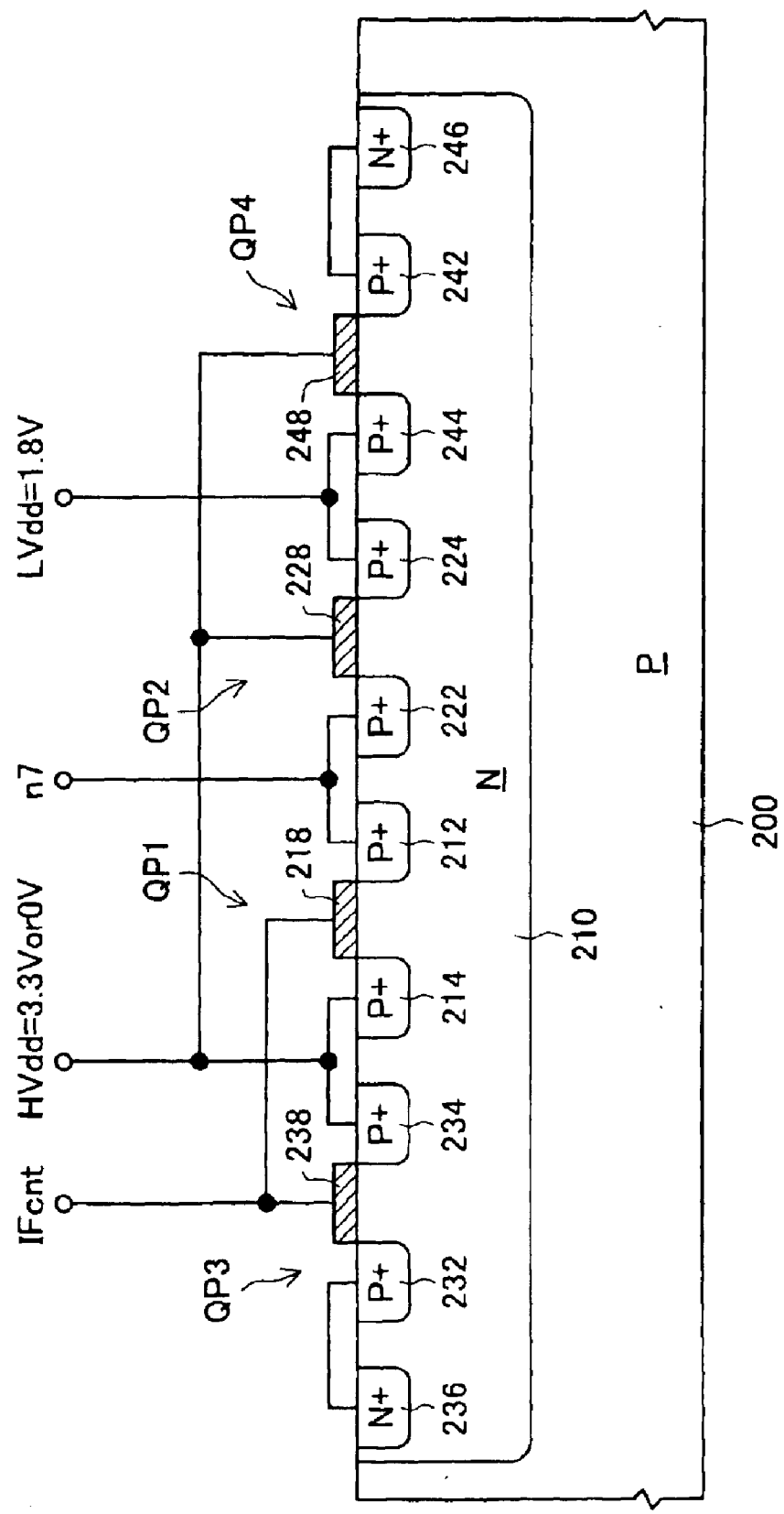
FIG. 3 is an explanatory diagram schematically showing a sectional structure of the first to the fourth pMOS transistors QP1 to QP4 of the example.
Figure 4:
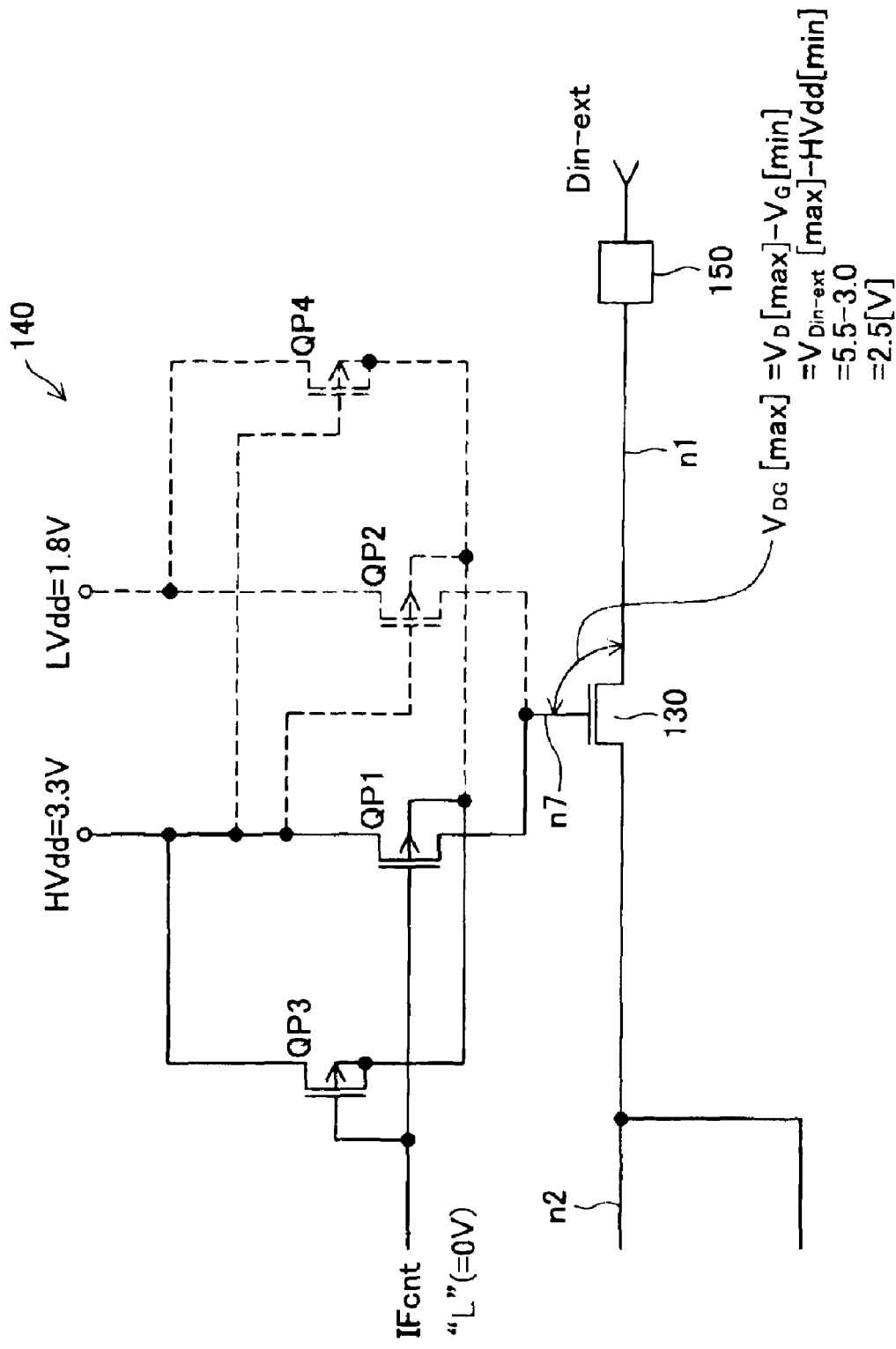
FIG. 4 is an explanatory diagram showing operation of a gate voltage control circuit 140 in an access mode.

FIG. 4 is an explanatory diagram showing operation of the gate voltage control circuit 140 in the access mode. In the access mode, both of the two power supply voltages HVdd and LVdd are supplied to the semiconductor integrated circuit. Also, the interface control signal IFcnt turns the "L" level (≈0V). At that time, the second and the fourth pMOS transistors QP2 and QP4 turn off because the potential of the gate electrode due to the first power supply voltage HVdd is higher than the potential of the source electrode due to the second power supply voltage LVdd. On the other hand, the third pMOS transistor QP3 turns on, thereby applying a voltage almost equal to the first power supply voltage HVdd to the backgate electrode of the first pMOS transistor QP1 (the region of n-type impurity 236 shown in FIG. 3) as described above. Consequently, the N well 210 where the first through the fourth pMOS transistors QP1 to QP4 are formed is charged so as to reach a potential almost equal to the first power supply voltage HVdd. Then, the first pMOS transistor QP1 turns on, thereby applying a voltage almost equal to the first power supply voltage HVdd (=3.3 V) to the output end n7 of the gate voltage control circuit 140, namely, the gate electrode of the transfer gate 130.

As mentioned above, similarly to the interface circuit of prior art, in the access mode, a voltage almost equal to the first power supply voltage HVdd (=3.3V) is applied to the gate electrode of the transfer gate 130. Consequently, even when a signal with a 5V potential higher than the withstand voltage (the maximum rated voltage allowable for the gate electrode) of the MOS transistor forming the input buffer 110 is input from the external input and output pad 150, the signal is converted into a signal with a voltage lower than the power supply voltage (3.3V in this example) by the transfer gate 130 and input to the input buffer 110.

Here, suppose that the potential of the "H" level of the external data signal Din-ext input from the external input and output pad 150 is (5±0.5)V.

At that time, the maximum value VD [max] of a drain voltage VD applied to the drain electrode of the transfer gate 130 is 5.5V. Moreover, the minimum value VG [min] of a gate voltage VG applied to the gate electrode is 3.0V. Therefore, the maximum value VDG [max] of a voltage VDG between the drain and the gate of the transfer gate 130 is 2.5V. As mentioned above, since the lowest value of the absolute maximum rated voltage allowable as the voltage VDG between the drain and the gate of the NMOS transistor forming the interface circuit is 4.0V, the maximum value VDG [max] of the voltage between the drain and the source of the transfer gate 130 is also lower than the absolute maximum rated voltage.

Figure 5:
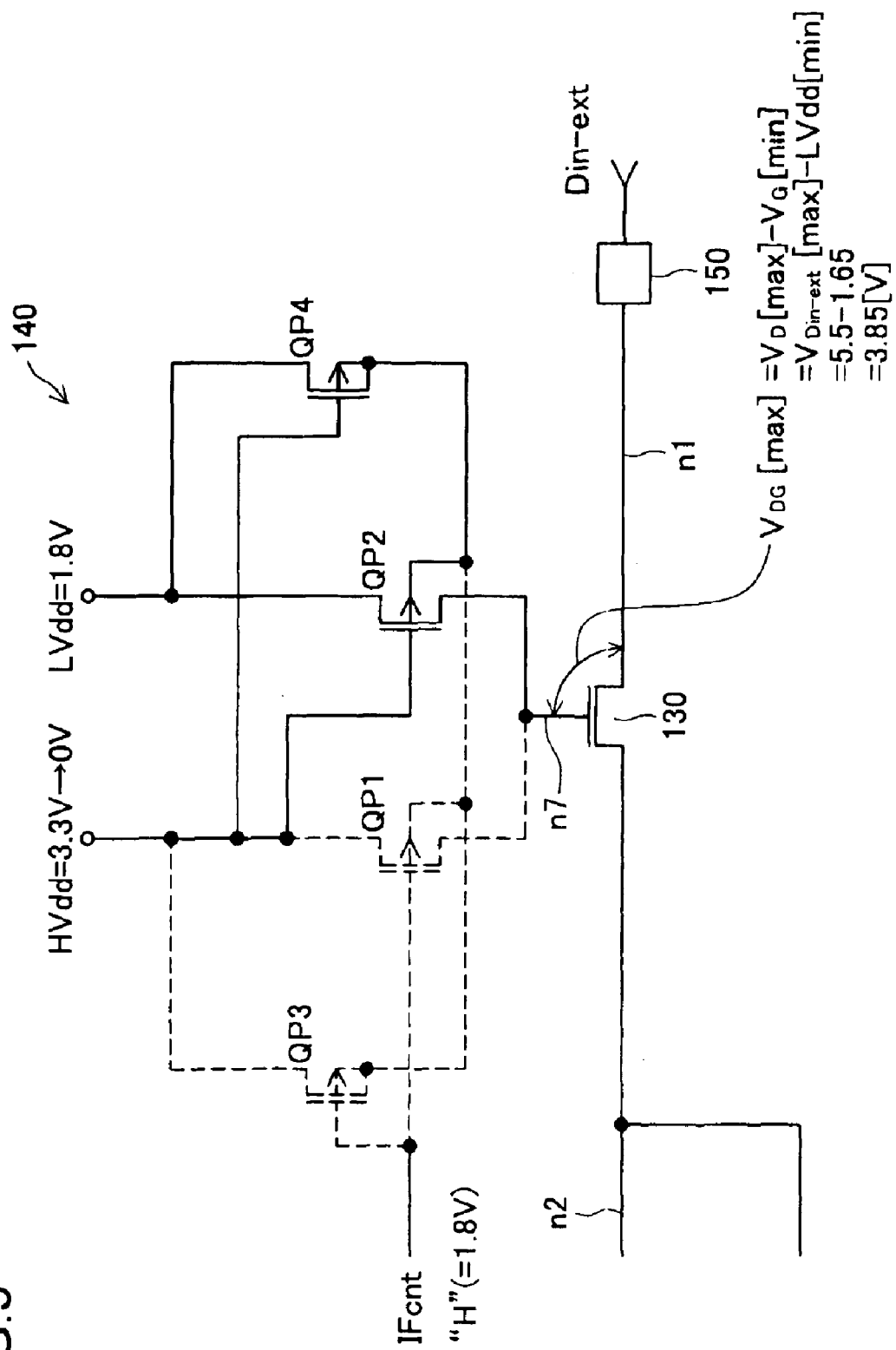
FIG. 5 is an explanatory diagram showing operation of the gate voltage control circuit 140 in a non-access mode.
Figure 6:
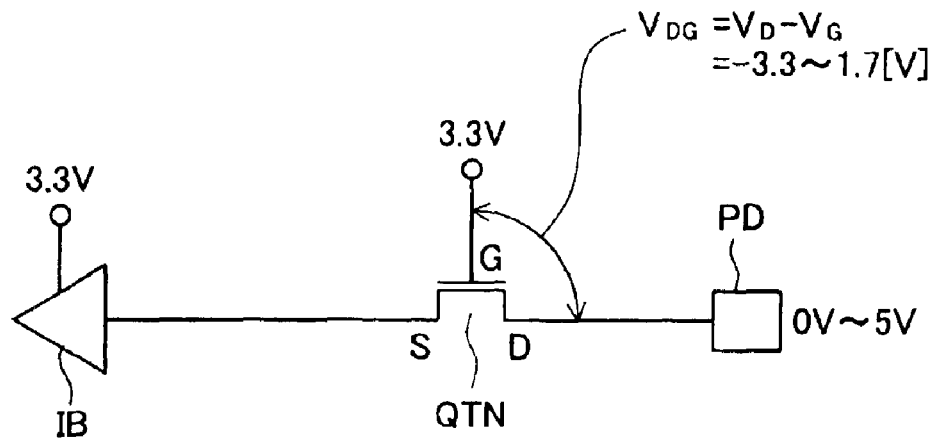
FIG. 6 is an explanatory diagram showing an interface circuit of prior art.
Figure 6:
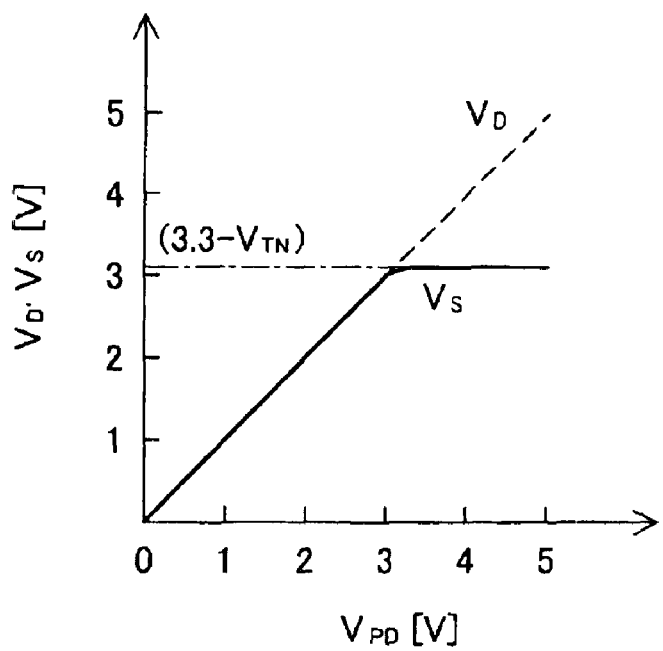
Figure 7:
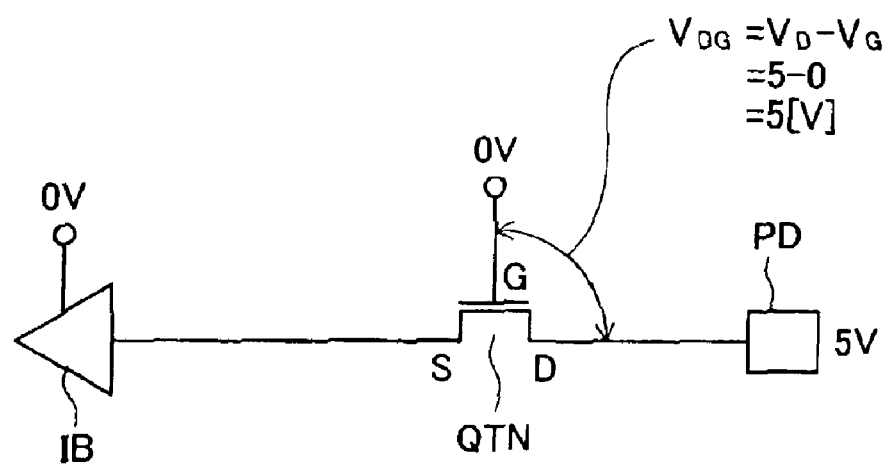
FIG. 7 is an explanatory diagram illustrating problems of the interface circuit of prior art.

FIG. 5 is an explanatory diagram showing operation of the gate voltage control circuit 140 in the non-access mode. In the non-access mode, supply of the first power supply voltage HVdd of the two power supply voltages HVdd and LVdd is shut off, and the voltage of the power supply voltage HVdd becomes almost 0V. At that time, operation of the input buffer 110 is suspended, so that the input data signal Din is never output towards the internal block even if the external data signal Din-ext is input from the external input and output pad 150. Also, the interface control signal IFcnt turns the "H" level (≈1.8V).

At that time, the first and the third pMOS transistors QP1 and QP3 turn off because the potential of the gate electrode, to which the "H" level (≈1.8V) interface control signal IFcnt is input, is greater than the potential of the source electrode (0V). On the other hand, the fourth pMOS transistor turns on, so that, as described above, an electric charge is stored into the backgate (the N well 210 in FIG. 3) of the second pMOS transistor QP2, thereby making the potential of the backgate become the second power supply voltage LVdd. Then, the second pMOS transistor QP2 turns on, thereby applying a voltage almost equal to the second power supply voltage LVdd (=1.8V) to the output end n7 of the gate voltage control circuit 140, namely, the gate electrode of the transfer gate 130.

Here, suppose that the external data signal Din-ext supposed to be supplied to another device is input from the external input and output pad 150, and that the potential of the "H" level of this external data signal Din-ext is in the range from 4.5V to 5.5V.

At that time, the maximum value VD [max] of the drain voltage VD applied to the drain electrode of the transfer gate 130 is 5.5V. Moreover, the minimum value VG [min] of the gate voltage VG applied to the gate electrode is 1.65V. Therefore, the maximum value VDG [max] of the voltage VDG between the drain and the gate of the transfer gate 130 is 3.85V. As mentioned above, since the lowest value of the absolute maximum rated voltage allowable as the voltage VDG between the drain and the gate of the nMOS transistor forming the interface circuit is 4.0V, the maximum value VDG [max] of the voltage between the drain and the source of the transfer gate 130 is lower than the absolute maximum rated voltage.

As described above, even when supply of the first power supply HVdd for the interface circuit is shut off in response to the non-access mode, the gate voltage control circuit 140 is capable of supplying a voltage almost equal to the power supply voltage LVdd as the gate voltage of the transfer gate 130. Therefore, the voltage VDG between the drain and the source of the transfer gate 130 can be prevented from exceeding the allowable absolute maximum rated voltage unlike with the interface circuit of prior art facing such a problem.

As described above, in the access mode, the interface circuit 100 of this example can receive, as the external data signal Din-ext, an "H" level (5±0.5V) signal which is greater than the first power supply voltage HVdd (=3.3V) and also greater than the absolute maximum rated voltage allowable as the gate voltage of the MOS transistor forming the input buffer 110. Moreover, it has been a problem with an interface circuit of prior art in the non-access mode that an "H" level potential of an external data signal to be supplied to another device is input through the external input and output pad 150 and then the voltage VDG between the drain and the source of the transfer gate 130 exceeds the allowable absolute maximum rated voltage. This problem is also cleared in the present example.

As made clear from the above explanation, the first power supply voltage corresponds to the first voltage of the invention, the second power supply voltage corresponds to the second voltage of the invention, and the "H" level potential of an external data signal corresponds to the third voltage.

Moreover, it should be understood that the invention is not limited to the above example and embodiment, and is applicable to various modes within the range without departing from the spirit and scope of the invention. For example, the following modification is also feasible.

(1) Shown as the interface circuit 100 of the above example is an input and output interface circuit incorporating the input buffer 110 and the output driver. However, it should be understood that the invention is applicable to an input interface circuit incorporating only the input buffer 110.

(2) The above example illustrates a case that the first power supply voltage HVdd is 3.3V, the second power supply voltage LVdd is 1.8V, the potential of the "H" level of an external data signal is 5V, and the absolute maximum rated voltage of the voltage VDG between the drain and the gate of the transfer gate 130 is 4.0V. However, the invention is not limited thereto. The invention is applicable: when the transfer gate includes an nMOS transistor in which the maximum rated voltage between a gate electrode and a drain electrode is higher than the first voltage corresponding to the first power supply voltage HVdd and is lower than the third voltage corresponding to the "H" level potential of an external data signal, and when the first voltage, the second voltage and the third voltage are set such that the difference between the third voltage and the second voltage corresponding to the second power supply voltage LVdd is lower than the maximum rated voltage of the gate electrode and smaller than the maximum rated voltage between the gate electrode and the drain electrode.

While the invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

What is claimed is:

1. A semiconductor integrated circuit including an interface circuit which receives a relatively high first voltage and a relatively low second voltage as power supply voltages, and suspends operation of the interface circuit in a non-access mode so that an external access is not executed by shutting off supply of the first voltage to be applied to the interface circuit that receives an externally supplied signal, the interface circuit comprising:

an input buffer that operates by applying at least the first voltage as the power supply voltage;

a transfer gate that is coupled to and between an external input terminal and an input end of the input buffer, and that transmits an external signal input from the external input terminal to the input end of the input buffer; and a gate voltage control circuit that outputs a gate voltage to be applied to a gate electrode of the transfer gate, the gate voltage control circuit outputting a voltage produced based on the first voltage as the gate voltage in an access mode so that an external access is executed while outputting a voltage produced based on the second voltage as the gate voltage in the non-access mode.

2. The semiconductor integrated circuit according to claim 1, the gate voltage control circuit comprising four (4) p-type MOS transistors formed in a same n-type substrate region, a first p-type MOS transistor comprising a source electrode, to which the first voltage is applied, and a drain electrode, to which the gate electrode of the transfer gate is coupled, and turns on in the access mode so as to output a voltage almost equal to the first voltage to the gate electrode of the transfer gate;

a second p-type MOS transistor comprising a source electrode, to which the second voltage is applied, and a drain electrode, to which the gate electrode of the transfer gate is coupled, and turns on in the non-access mode so as to output a voltage almost equal to the second voltage to the gate electrode of the transfer gate;

a third p-type MOS transistor comprising a source electrode, to which the first voltage is applied, and a drain electrode, to which a first electrode in the n-type substrate region is coupled, and turns on in the access mode, thereby performing charging such that a potential of the n-type substrate region becomes almost equal to the first voltage; and a fourth p-type MOS transistor comprising a source electrode, to which the second voltage is applied, and a drain electrode, to which a second electrode in the n-type substrate region is coupled, and turns on in the non-access mode, thereby performing charging such that the potential of the n-type substrate region becomes almost equal to the second voltage.

3. The semiconductor integrated circuit according to claim 1, each MOS transistor forming the interface circuit being an MOS transistor in which a maximum rated voltage at a gate electrode is greater than the first voltage and lower than a third voltage corresponding to a high level voltage of the external signal, and the second voltage being set such that a voltage difference between the third voltage and the second voltage is lower than the maximum rated voltage.

4. The semiconductor integrated circuit according to claim 1, the first voltage being in the range from 3V to 3.6V, the second voltage being in the range from 1.65V to 1.95V, and the third voltage being in the range a voltage from 4.5V to 5.5V.

5. The semiconductor integrated circuit according to claim 2, each MOS transistor forming the interface circuit being an MOS transistor in which a maximum rated voltage at a gate electrode is greater than the first voltage and lower than a third voltage corresponding to a high level voltage of the external signal, and the second voltage being set such that a voltage difference between the third voltage and the second voltage is lower than the maximum rated voltage.

6. The semiconductor integrated circuit according to claim 2, the first voltage being in the range from 3V to 3.6V, the second voltage being in the range from 1.65V to 1.95V, and the third voltage being in the range a voltage from 4.5V to 5.5V.

* * * * *